United States Patent
Kogo et al.

(10) Patent No.: US 6,639,540 B1
(45) Date of Patent: Oct. 28, 2003

(54) A/D CONVERTER WITH NOISE ELIMINATION FUNCTION

(75) Inventors: Teruyuki Kogo, Hyogo (JP); Kenji Kubo, Hyogo (JP)

(73) Assignees: Mitsubishi Denki Kabushiki Kaisha, Tokyo (JP); Mitsubishi Electric System LSI Design Corporation, Itami (JP)

( * ) Notice: Subject to any disclaimer, the term of this patent is extended or adjusted under 35 U.S.C. 154(b) by 0 days.

(21) Appl. No.: 10/326,055

(22) Filed: Dec. 23, 2002

(30) Foreign Application Priority Data

Apr. 25, 2002 (JP) ......................................... 2002-124722

(51) Int. Cl.⁷ ................................................. H03M 1/12
(52) U.S. Cl. ......................... 341/155; 341/118; 341/120
(58) Field of Search ................................ 341/118, 120, 341/155

(56) References Cited

U.S. PATENT DOCUMENTS 5,307,066 A * 4/1994 Kobayashi et al. ......... 341/155
5,373,293 A * 12/1994 Hirata ......................... 341/118
5,640,161 A * 6/1997 Johnson et al. ............. 341/122
5,663,729 A * 9/1997 Wada et al. ................. 341/155

FOREIGN PATENT DOCUMENTS

JP  2001-111422  4/2001

* cited by examiner

Primary Examiner—Michael Tokar
Assistant Examiner—Khai Nguyen
(74) Attorney, Agent, or Firm—Burns, Doane, Swecker & Mathis, LLP

(57) ABSTRACT

An A/D converter includes a noise detector for generating a noise detection signal when it detects noise in an A/D conversion reference voltage; an A/D operation controller for generating a bit-shift signal in response to the noise detection signal; and an A/D conversion module for discarding an A/D conversion resultant bit affected by noise in response to the bit-shift signal, for holding the remaining A/D conversion resultant bits, and for restarting the A/D conversion from the discarded A/D conversion resultant bit after the noise becomes negligible. The A/D converter can obtain reliable A/D conversion data against the noise in the A/D conversion reference voltage without increasing the circuit scale so much.

8 Claims, 11 Drawing Sheets

FIG.11A (PRIOR ART)

EXPRESSION INDICATING RELATIONSHIPS BETWEEN Vref AND REFERENCE VOLTAGE VREF OF A/D CONVERTER.

| FOR n = 0 | $V_{ref} = 0$ |
|---|---|
| FOR n = 1-1023 | $V_{ref} = \dfrac{V_{REF}}{1024} \times n$ | n : VALUE OF A/D CONVERSION REGISTER (DECIMAL)

FIG.11B (PRIOR ART)

CHANGES IN A/D CONVERSION REGISTER DURING A/D CONVERSION.

| | CHANGES IN A/D CONVERSION REGISTER | COMPARISON VOLTAGE (Vref) |
|---|---|---|
| INITIAL STATE | 0 0 0 0 0 0 0 0 0 0 | 0 |
| FIRST COMPARISON | 1 0 0 0 0 0 0 0 0 0 | $\dfrac{V_{REF}}{2}$ |
| SECOND COMPARISON | *1 1 0 0 0 0 0 0 0 0 | $\dfrac{V_{REF}}{2} \pm \dfrac{V_{REF}}{4}$ |
| THIRD COMPARISON | *1 *2 1 0 0 0 0 0 0 0 | $\dfrac{V_{REF}}{2} \pm \dfrac{V_{REF}}{4} \pm \dfrac{V_{REF}}{8}$ |
| ... | ... | ... |
| END OF 10TH COMPARISON | A/D CONVERSION RESULT<br>*1 *2 *3 *4 *5 *6 *7 *8 *9 *10 | $\dfrac{V_{REF}}{2} \pm \dfrac{V_{REF}}{4} \pm \cdots \pm \dfrac{V_{REF}}{1024}$ |

*1-*10: 1ST TO 10TH COMPARISON RESULT

A/D CONVERTER WITH NOISE ELIMINATION FUNCTION

BACKGROUND OF THE INVENTION

1. Field of the Invention

The present invention relates to an A/D converter with noise elimination function in a semiconductor device.

2. Description of Related Art

FIG. 10 is a block diagram showing a configuration of a conventional A/D converter. In FIG. 10, the reference numeral 1 designates an A/D conversion reference voltage Vref; 2 designates a noise filtering module for removing noise from the A/D conversion reference voltage Vref 1; 3 designates an A/D conversion module for converting an analog input Ain to a digital output with reference to the A/D conversion reference voltage Vref 1; and 4 designates an A/D controller for controlling the A/D conversion module 3.

FIGS. 11A and 11B are tables illustrating a setting method of the A/D conversion reference voltage Vref of the A/D converter.

Next, the operation of the conventional A/D converter will be described.

In FIG. 10, the noise filtering module 2 removes the noise of the A/D conversion reference voltage Vref 1, and supplies its output to the A/D conversion module 3.

FIG. 11A gives expressions of the relationships between the A/D conversion reference voltage Vref 1 and the reference voltage VREF in the A/D conversion module 3; and FIG. 11B illustrates the variations in the content of the A/D conversion register in the A/D conversion module 3 during the A/D conversion.

When the A/D conversion is started, the A/D conversion register is placed at "0 . . . 0". Subsequently, the most significant bit of the A/D conversion register is placed at "1", and the A/D conversion reference voltage Vref 1 is supplied to the comparator in the A/D conversion module 3, which compares the A/D conversion reference voltage Vref 1 with the analog input Ain. If the compared result is Vref<Ain, the most significant bit of the A/D conversion register is maintained at "1", whereas if Vref>Ain, the most significant bit of the A/D conversion register is placed at "0".

Carrying out the foregoing operation down to the least significant bit of the A/D conversion register, the A/D conversion module 3 stores into the A/D conversion register the digital value obtained by converting the analog input Ain.

With the foregoing configuration, the conventional A/D converter cannot obtain accurate A/D conversion data when the A/D conversion reference voltage Vref 1 includes noise. Thus, it includes the noise filtering module 2 for removing noise from the A/D conversion reference voltage Vref 1 so as to supply the noise reduced A/D conversion reference voltage Vref 1 to the A/D conversion module 3.

However, the conventional A/D converter has a problem of being unable to obtain the accurate A/D conversion data if the A/D conversion reference voltage Vref 1 includes noise that cannot be removed by the noise filtering module 2. In addition, it has a problem of increasing the circuit scale because of the noise filtering module 2.

SUMMARY OF THE INVENTION

The present invention is implemented to solve the foregoing problems. It is therefore an object of the present invention to provide an A/D converter capable of obtaining reliable A/D conversion data without increasing the circuit scale so much even if the A/D conversion reference voltage includes noise.

According to a first aspect of the present invention, there is provided an A/D converter including: an A/D operation controller for generating a bit-shift signal in response to a detection signal fed from a detector; and an A/D conversion module for carrying out A/D conversion with reference to an A/D conversion reference voltage, for discarding an A/D conversion resultant bit affected by noise in response to the bit-shift signal, for holding remaining A/D conversion resultant bits, and for restarting the A/D conversion from the discarded A/D conversion resultant bit after the noise becomes negligible. It offers an advantage of being able to improve the reliability of the A/D conversion data by discarding the A/D conversion resultant bit affected by sudden noise or crosstalk noise during the USB communication.

According to a second aspect of the present invention, there is provided an A/D converter including: an A/D conversion module for generating A/D conversion resultant data by carrying out A/D conversion of an analog input signal with reference to an A/D conversion reference voltage; and an A/D operation controller for deciding an A/D conversion resultant bit affected by noise in response to the detection signal and to the A/D conversion resultant data, and for outputting reliability information together with the A/D conversion resultant data. It can learn the reliability of the A/D conversion resultant data affected by the sudden noise or crosstalk noise during the USB communication. As a result, it offers an advantage of being able to improve the reliability of the A/D conversion data by discarding the A/D conversion resultant data with the reliability less than a certain level.

BRIEF DESCRIPTION OF THE DRAWINGS

FIGS. 11A and 11B are tables illustrating a setting method of the A/D conversion reference voltage of the conventional A/D converter.

DETAILED DESCRIPTION OF THE PREFERRED EMBODIMENTS

The invention will now be described with reference to the accompanying drawings.

EMBODIMENT 1

Figure 1:
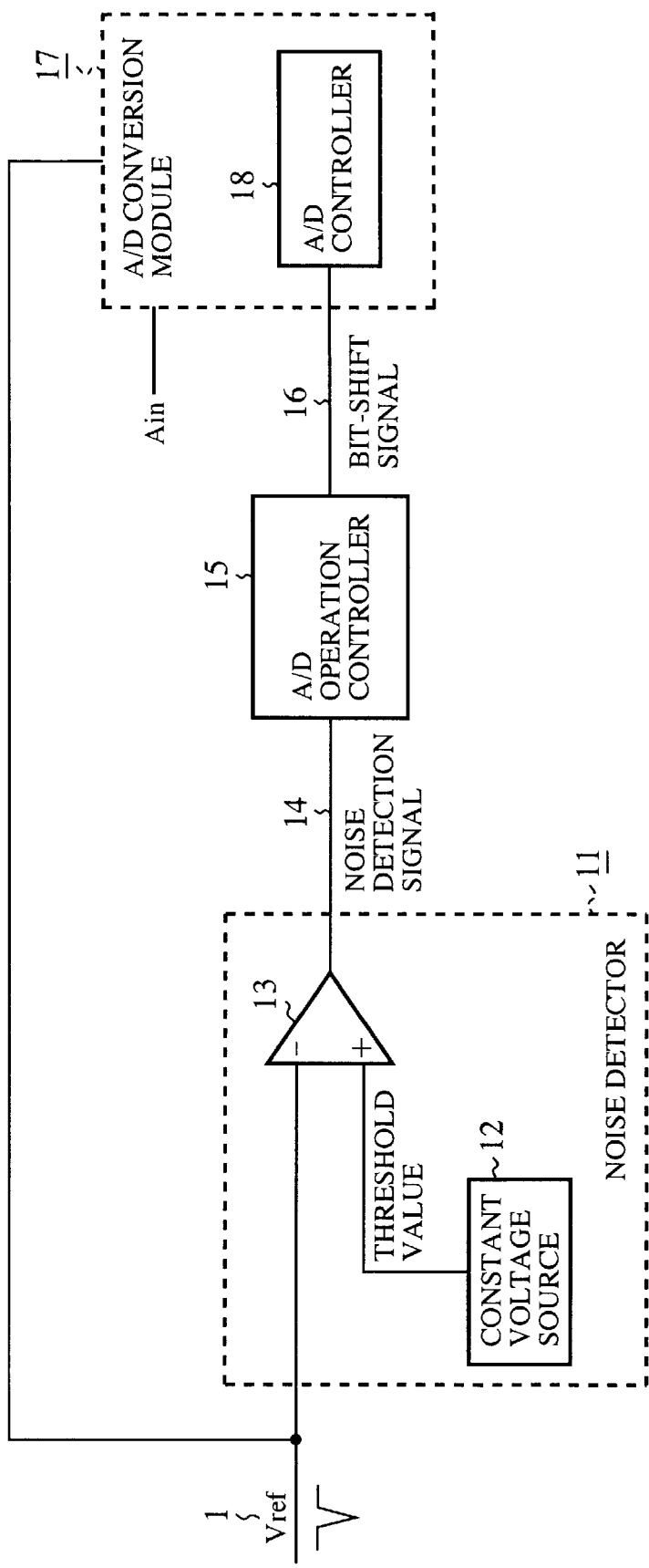
FIG. 1 is a block diagram showing a configuration of an embodiment 1 of the A/D converter in accordance with the present invention.

FIG. 1 is a block diagram showing a configuration of an embodiment 1 of the A/D converter in accordance with the present invention. In this figure, the reference numeral 1 designates an A/D conversion reference voltage Vref. The reference numeral 11 designates a noise detector for generating a noise detection signal 14 when it detects noise in the A/D conversion reference voltage Vref 1. The noise detector 11 includes a constant voltage source 12 and a comparator 13. The reference numeral 15 designates an A/D operation controller composed of SR flip-flops and the like, for generating a bit-shift signal 16 in response to the noise detection signal 14 fed from the noise detector 11. The reference numeral 17 designates an A/D conversion module for converting an analog input Ain to a digital output with reference to the A/D conversion reference voltage Vref 1; and 18 designates an A/D controller that discards an A/D conversion resultant bit affected by noise in response to the bit-shift signal 16 fed from the A/D operation controller 15, holds the remaining A/D conversion resultant bits, and restarts the A/D conversion from the discarded A/D conversion resultant bit after the noise becomes negligible.

Next, the operation of the present embodiment 1 will be described.

In FIG. 1, when any noise occurs.in the A/D conversion reference voltage Vref 1, the noise detector 11 detects the noise, and supplies the noise detection signal 14 to the A/D operation controller 15. In response to the noise detection signal 14, the A/D operation controller 15 generates the bit-shift signal 16 for removing the A/D conversion resultant bit affected by the noise using the SR flip-flops and the like. In the A/D conversion module 17 which carries out the A/D conversion of the analog input Ain in accordance with the A/D conversion reference voltage Vref 1, the A/D controller 18 discards the A/D conversion resultant bit affected by the noise in response to the bit-shift signal 16 fed from the A/D operation controller 15. Then, the A/D conversion module 17, which holds the remaining A/D conversion resultant bits, restarts the A/D conversion from the discarded A/D conversion resultant bit after the noise becomes negligible.

As described above, the present embodiment 1 can improved the reliability of the A/D conversion data by discarding the A/D conversion resultant bit affected by sudden noise.

In addition, the present embodiment does not require any general-purpose counter, and can perform the A/D conversion with simpler operation without interrupting the A/D conversion.

Furthermore, the present embodiment 1 can improve the reliability of the A/D conversion data by using simple circuits such as the noise detector 11 and A/D operation controller 15 without increasing the circuit scale.

EMBODIMENT 2

Figure 2:
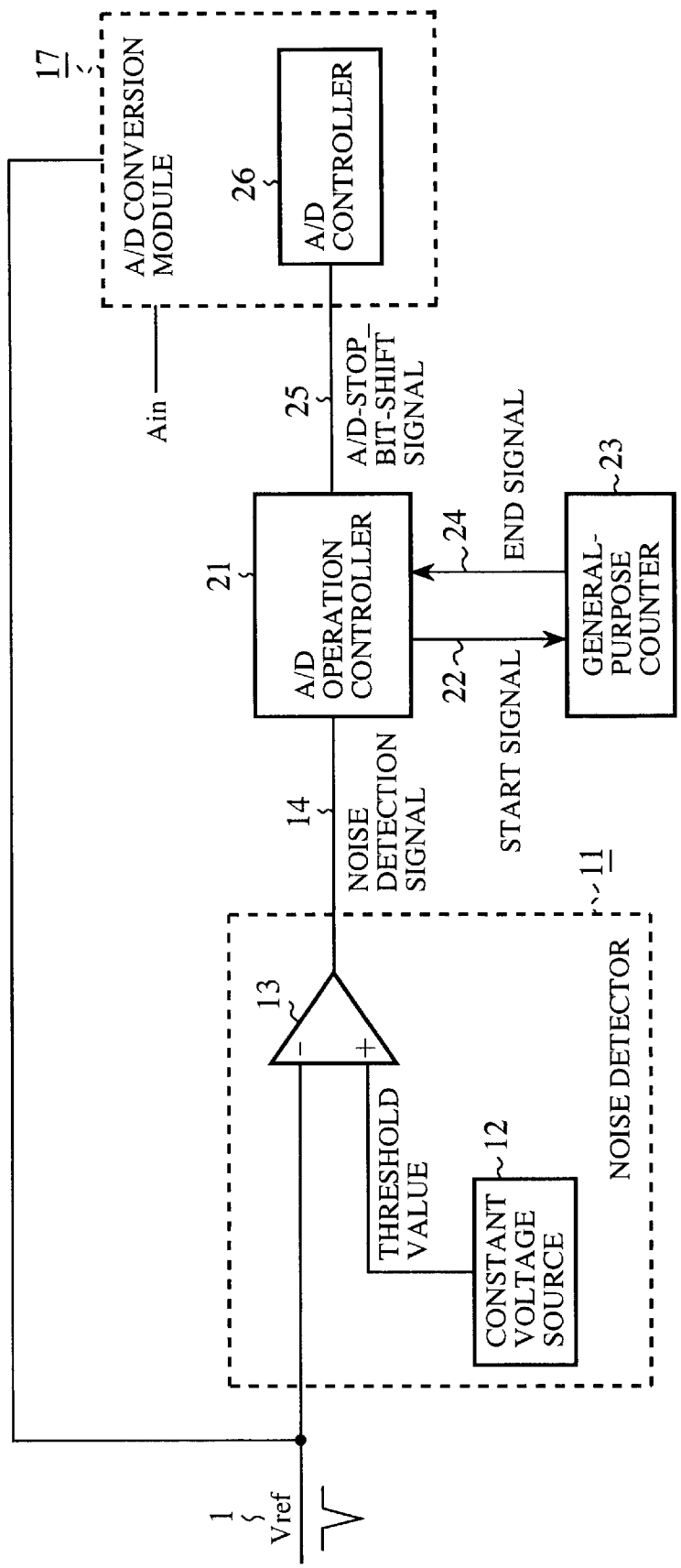
FIG. 2 is a block diagram showing a configuration of an embodiment 2 of the A/D converter in accordance with the present invention.

FIG. 2 is a block diagram showing a configuration of an embodiment 2 of the A/D converter in accordance with the present invention. In this figure, the reference numeral 21 designates an A/D operation controller composed of SR flip-flops and the like. The A/D operation controller 21 generates a start signal 22 in response to the noise detection signal 14 fed from the noise detector 11, and generates an asserted A/D-stop_bit-shift signal 25 from the generation of the start signal 22 to the reception of an end signal 24 fed from a general-purpose counter 23. The general-purpose counter 23 starts counting a fixed time period in response to the start signal 22 fed from the A/D operation controller 21, and generates the end signal 24 at the end of the counting. The reference numeral 26 designates an A/D controller for discarding an A/D conversion resultant bit affected by the noise in response to the asserted A/D-stop_bit-shift signal 25 fed from the A/D operation controller 21, and for holding the remaining A/D conversion resultant bits. The A/D controller 26 restarts A/D conversion from the A/D conversion resultant bit in response to an unasserted A/D-stop_bit-shift signal 25 fed from the A/D operation controller 21. The remaining configuration is the same as that of FIG. 1.

Next, the operation of the present embodiment 2 will be described.

The A/D operation controller 21 in FIG. 2 interrupts the A/D conversion in response to the noise detection signal 14 using the SR flip-flops and the like, generates the asserted A/D-stop_bit-shift signal 25 for removing the A/D conversion resultant bit affected by noise, and supplies it to the A/D controller 26. The A/D operation controller 21 also generates the start signal 22, and supplies it to the general-purpose counter 23.

In the A/D conversion module 17 which is carrying out the A/D conversion of the analog input Ain in response to the A/D conversion reference voltage Vref 1, the A/D controller 26 discards the A/D conversion resultant bit affected by noise in response to the asserted A/D-stop_bit-shift signal 25 fed from the A/D operation controller 21. The A/D controller 26 holds the remaining A/D conversion resultant bits.

On the other hand, the general-purpose counter 23 starts counting the fixed time period in response to the start signal 22, and supplies the end signal 24 to the A/D operation controller 21 at the end of the counting. The fixed time period of the general-purpose counter 23 is determined considering the pulse width of the noise at such a value that the effect of the noise on the A/D conversion can be avoided.

In response to the input of the end signal 24, the A/D operation controller 21, ensuring that the noise detector 11 does not generate the noise detection signal 14, changes the A/D-stop_bit-shift signal 25 from the asserted to unasserted signal and supplies it to the A/D controller 26. The A/D controller 26 restarts the A/D conversion from the discarded A/D conversion resultant bit in response to the unasserted A/D-stop_bit-shift signal 25.

As described above, the present embodiment 2 can improve the reliability of the A/D conversion data by discarding the A/D conversion resultant bit affected by the sudden noise.

In addition, since the A/D conversion module 17 halts the A/D conversion only for the fixed time period counted by the general-purpose counter 23 from the noise detection, the present embodiment 2 can prevent the adverse effect of the noise on the A/D conversion data.

EMBODIMENT 3

Figure 3:
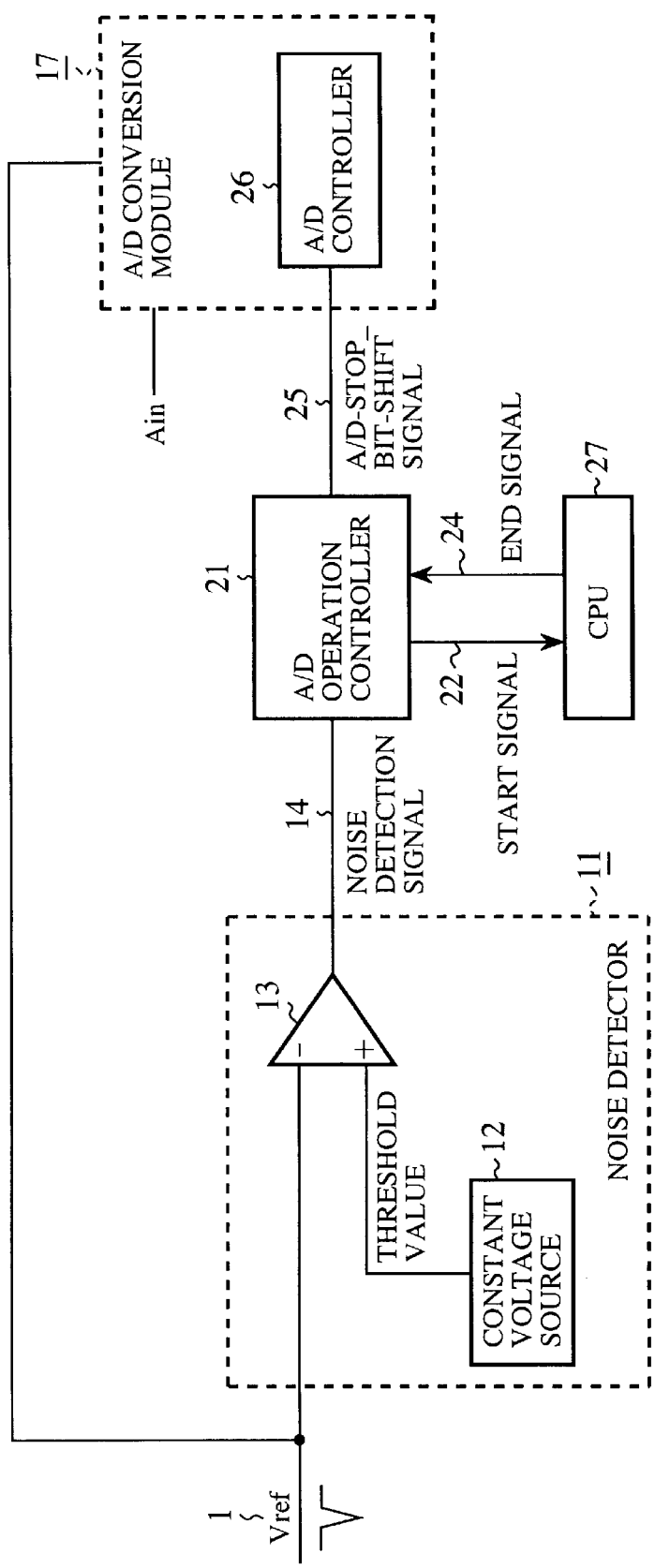
FIG. 3 is a block diagram showing a configuration of an embodiment 3 of the A/D converter in accordance with the present invention.

FIG. 3 is a block diagram showing a configuration of an embodiment 3 of the A/D converter in accordance with the present invention. In this figure, the reference numeral 27 designates a CPU that starts-counting a fixed time period on software in response to the start signal 22 fed from the A/D operation controller 21, and generates the end signal 24 at the end of the counting. The remaining configuration is the same as that of FIG. 2.

Next, the operation of the present embodiment 3 will be described.

The present embodiment 3 replaces the general-purpose counter 23 of the foregoing embodiment 2 by the CPU 27.

In FIG. 3, the CPU 27 starts counting the fixed time period on the software in response to the start signal 22 fed from the A/D operation controller 21, and supplies the end signal 24 to the A/D operation controller 21 at the end of the counting. The remaining operation is the same as that of the foregoing embodiment 2.

As described above, the present embodiment 3 can improve the reliability of the A/D conversion data by discarding the A/D conversion resultant bit affected by sudden noise.

In addition, since the A/D conversion module 17 halts the A/D conversion only for the fixed time period counted by the CPU 27 from the detection of the noise, it can prevent the adverse effect of the noise on the A/D conversion data.

Furthermore, using the CPU 27 can obviate the need for the general-purpose counter 23.

EMBODIMENT 4

Figure 4:
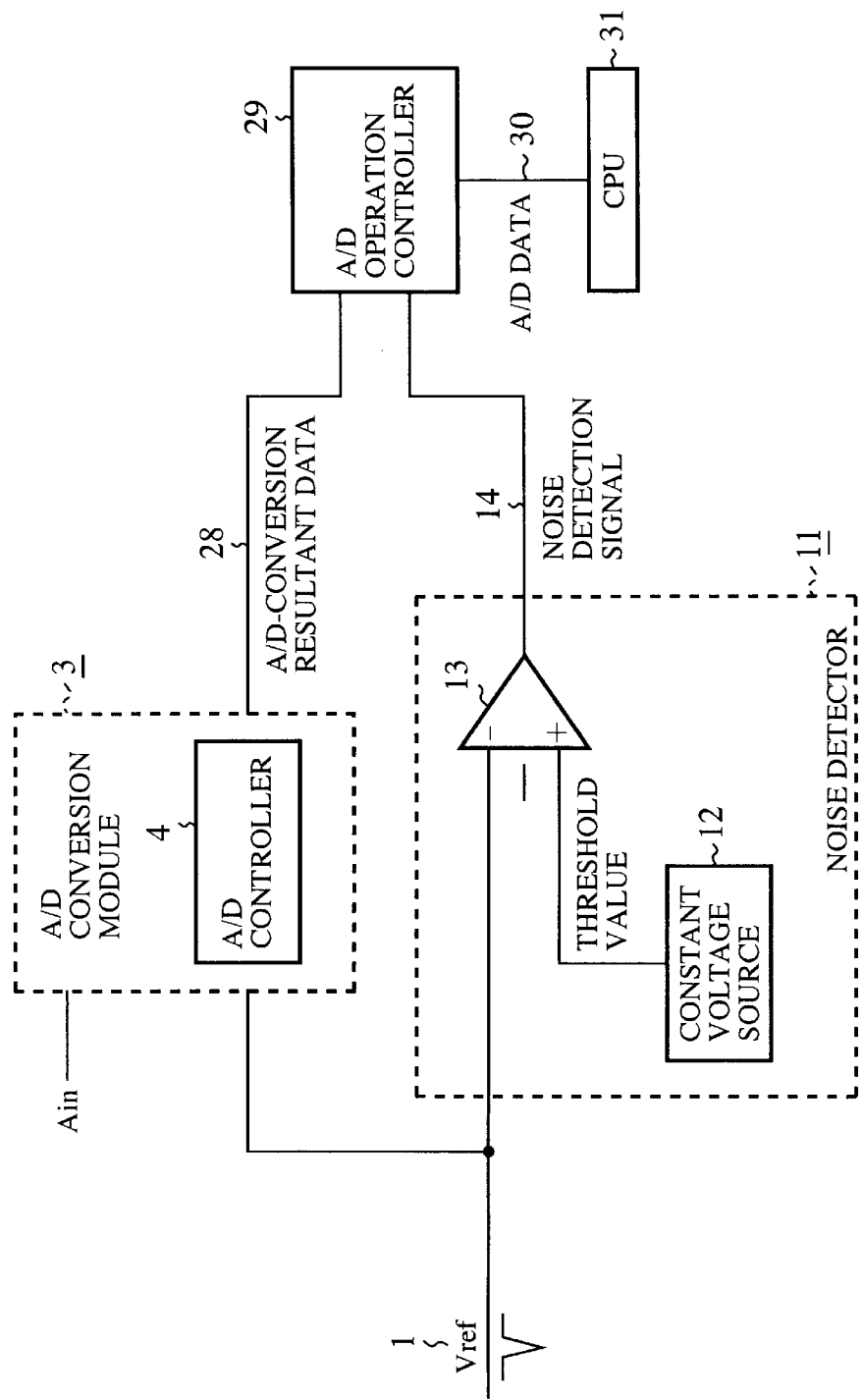
FIG. 4 is a block diagram showing a configuration of an embodiment 4 of the A/D converter in accordance with the present invention.

FIG. 4 is a block diagram showing a configuration of an embodiment 4 of the A/D converter in accordance with the present invention. In this figure, the reference numeral 3 designates an A/D conversion module for converting the analog input Ain to the digital output in accordance with the A/D conversion reference voltage Vref 1; and 4 designates an A/D controller for controlling the A/D conversion module 3. The reference numeral 28 designates A/D conversion resultant data output from the A/D conversion module 3.

The reference numeral 29 designates an A/D operation controller that decides an A/D conversion resultant bit affected by noise in response to the noise detection signal 14 fed from the noise detector 11 and to the A/D conversion resultant data 28 fed from the A/D conversion module 3, and outputs A/D data 30 including the A/D conversion resultant data 28 and its reliability information. The reference numeral 31 designates a CPU for making a decision from the A/D data 30 as to whether to adopt the A/D conversion resultant data 28 or not in response to the reliability information. The remaining configuration is the same as that of FIG. 1.

Next, the operation of the present embodiment 4 will be described.

The A/D conversion module 3 converts the analog input Ain to the digital output with reference to the A/D conversion reference voltage Vref 1, and outputs the A/D conversion resultant data 28.

The A/D operation controller 29 decides an A/D conversion resultant bit affected by noise in response to the noise detection signal 14 fed from the noise detector 11 and to the A/D conversion resultant data 28 fed from the A/D conversion module 3, and decides the reliability of the A/D conversion resultant data 28. Then, the A/D operation controller 29 outputs the A/D data 30 including the A/D conversion resultant data 28 and its reliability information.

The CPU 31 makes a decision from the A/D data 30 as to whether to adopt the A/D conversion resultant data 28 or not in response to the reliability information.

As described above, the present embodiment 4 can learn the reliability of the A/D conversion resultant data 28 affected by the sudden noise. As an example of using the reliability information, the present embodiment 4 can discard the A/D conversion resultant data 28 with the reliability below a certain level, thereby being able to improve the reliability of the A/D conversion data.

EMBODIMENT 5

Figure 5:
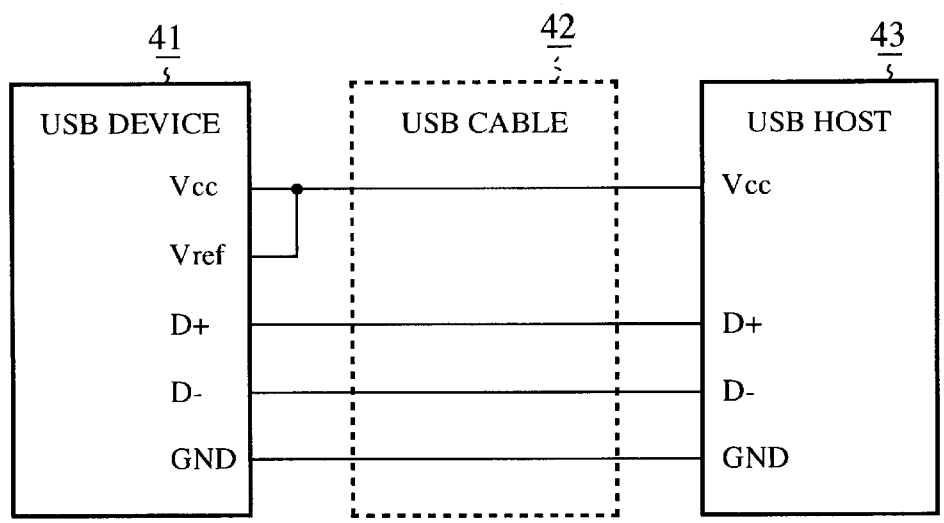
FIG. 5 is a block diagram showing a configuration of a semiconductor device with a USB function associated with an embodiment 5 in accordance with the present invention.

FIG. 5 is a block diagram showing a configuration of a semiconductor device with a USB (Universal Serial Bus) function associated with an embodiment 5 in accordance with the present invention. In this figure, the reference numeral 41 designates a USB device including a power supply terminal Vcc, an A/D conversion reference voltage terminal Vref, USB communication signal terminals D+ and D−, and a ground terminal GND. The reference numeral 42 designates a USB cable; and 43 designates a USB host including a power supply terminal Vcc, USB communication signal terminals D+ and D−, and a ground terminal GND.

Figure 6:
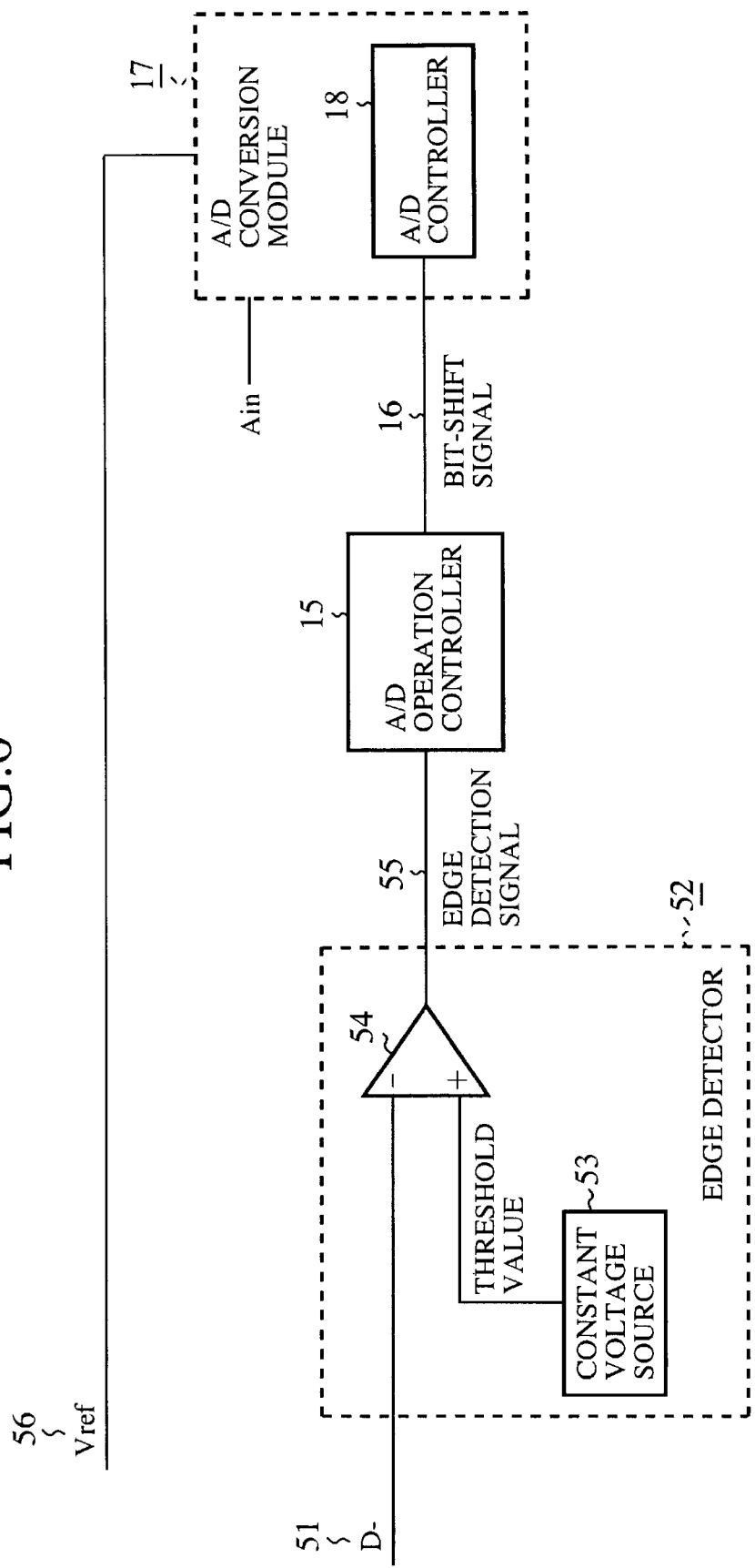
FIG. 6 is a block diagram showing a configuration of the embodiment 5 of the A/D converter in accordance with the present invention.

FIG. 6 is a block diagram showing a configuration of an embodiment 5 of the A/D converter in accordance with the present invention. In this figure, the reference numeral 51 designates a USB communication signal D−; and 52 designates an edge detector for detecting an edge of the USB communication signal D−, and for generating an edge detection signal 55 when it detects the occurrence of the USB communication. The edge detector 52 includes a constant voltage source 53 and a comparator 54. The reference numeral 15 designates an A/D operation controller that is composed of SR flip-flops and the like, and generates a bit-shift signal 16 in response to the edge detection signal 55 fed from the edge detector 52.

The reference numeral 56 designates an A/D conversion reference voltage Vref provided by the USB communication. The reference numeral 17 designates an A/D conversion module for converting the analog input Ain to the digital output with reference to the A/D conversion reference voltage Vref 56 provided by the USB communication; and 18 designates an A/D controller that discards an A/D conversion resultant bit affected by noise in response to the bit-shift signal 16 fed from the A/D operation controller 15, holds the remaining A/D conversion resultant bits, and restarts the A/D conversion from the discarded A/D conversion resultant bit after the noise becomes negligible.

Next, the operation of the present embodiment 5 will be described.

In FIG. 5, the present embodiment 5 has the USB (Universal Serial Bus) function associated with the USB device 41, USB cable 42 and USB host 43, and has a mode of supplying the power supply Vcc and A/D conversion reference voltage Vref from the USB host 43 to the USB device 41 through the USB cable 42. In the USB communication using the USB communication signals D+ and D−, the USB cable 42 has crosstalk noise occurring therein. As a result, the A/D conversion in accordance with the A/D conversion reference voltage Vref provided by the USB communication will degrade the A/D conversion accuracy. The present embodiment 5 is implemented to circumvent the degradation in the A/D conversion accuracy.

In FIG. 6, when the USB communication takes place using the USB communication signal D−, the edge detector 52 detects the edge of the USB communication signal D−, and generates the edge detection signal 55. In response to the edge detection signal 55, the A/D operation controller 15 generates the bit-shift signal 16 for removing the A/D conversion resultant bit affected by the noise using the SR flip-flops and the like. In the A/D conversion module 17 which carries out the A/D conversion of the analog input Ain in accordance with the A/D conversion reference voltage Vref 56 provided by the USB communication, the A/D controller 18 discards the A/D conversion resultant bit affected by the noise in response to the bit-shift signal 16 fed from the A/D operation controller 15. Then, the A/D conversion module 17 holds the remaining A/D conversion resultant bits, and restarts the A/D conversion from the discarded A/D conversion resultant bit after the noise becomes negligible.

As described above, the present embodiment 5 can improved the reliability of the A/D conversion data by discarding the A/D conversion resultant bit affected by the crosstalk noise occurring during the USB communication.

In addition, the present embodiment does not require any general-purpose counter, and can perform the A/D conversion with simpler operation without interrupting the A/D conversion.

Furthermore, the present embodiment 5 can improve the reliability of the A/D conversion data by using simple circuits such as the edge detector 52 and A/D operation controller 15 without increasing the circuit scale.

EMBODIMENT 6

Figure 7:
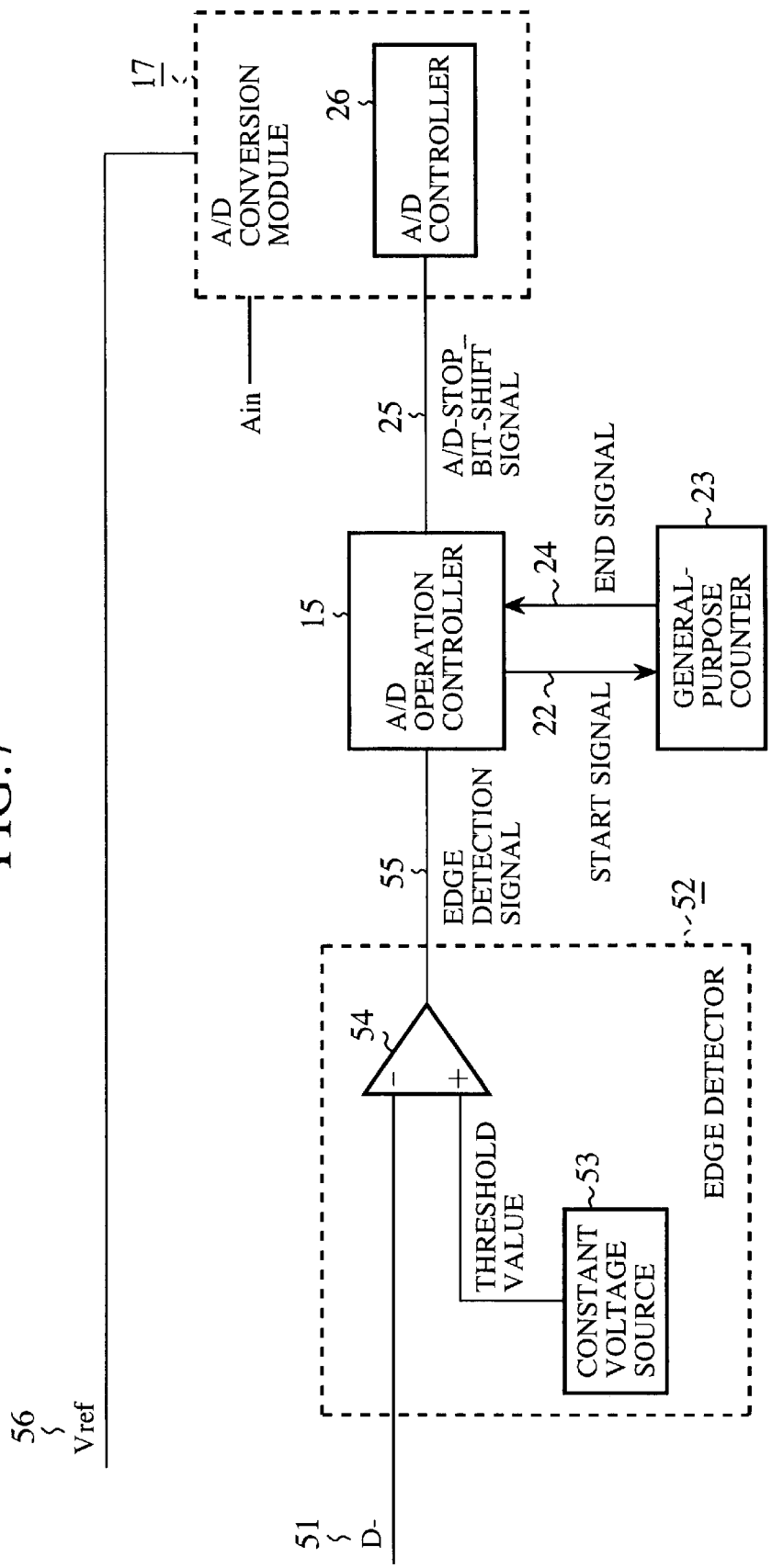
FIG. 7 is a block diagram showing a configuration of an embodiment 6 of the A/D converter in accordance with the present invention.

FIG. 7 is a block diagram showing a configuration of an embodiment 6 of the A/D converter in accordance with the present invention. In this figure, the reference numeral 21 designates an A/D operation controller composed of SR flip-flops and the like. The A/D operation controller 21 generates a start signal 22 in response to the edge detection signal 55 fed from the edge detector 52, and continues to generate an asserted A/D-stop_bit-shift signal 25 during the time from the generation of the start signal 22 to the reception of an end signal 24 from a general-purpose counter 23. The general-purpose counter 23 starts counting of the fixed time period in response to the start signal 22 fed from the A/D operation controller 21, and generates the end signal 24 at the end of the counting. The reference numeral 26 designates an A/D controller for discarding an A/D conversion resultant bit affected by the noise in response to the asserted A/D-stop_bit-shift signal 25 fed from the A/D operation controller 21, and for holding the remaining A/D conversion resultant bits. The A/D controller 26 restarts A/D conversion from the A/D conversion resultant bit in response to the unasserted A/D-stop_bit-shift signal 25 fed from the A/D operation controller 21. The remaining configuration is the same as that of FIG. 6.

Next, the operation of the present embodiment 6 will be described.

The A/D operation controller 21 in FIG. 7 interrupts the A/D conversion in response to the edge detection signal 55 using the SR flip-flops and the like, generates the asserted A/D-stop_bit-shift signal 25 for removing the A/D conversion resultant bit affected by noise, and supplies it to the AID controller 26. The A/D operation controller 21 also generates the start signal 22, and supplies it to the general-purpose counter 23.

In the A/D conversion module 17 which is carrying out the A/D conversion of the analog input Ain in response to the A/D conversion reference voltage Vref 1, the A/D controller 26 discards the A/D conversion resultant bit affected by noise in response to the asserted A/D-stop_bit-shift signal 25 fed from the A/D operation controller 21. The A/D controller 26 holds the remaining A/D conversion resultant bits.

On the other hand, the general-purpose counter 23 starts counting the fixed time period in response to the start signal 22, and supplies the end signal 24 to the A/D operation controller 21 at the end of the counting. The fixed time period of the general-purpose counter 23 is determined considering the pulse width of the noise at such a value that the effect of the noise on the A/D conversion can be avoided.

In response to the input of the end signal 24, the A/D operation controller 21, ensuring that the edge detector 52 does not generate the edge detection signal 55, changes the A/D-stop_bit-shift signal 25 from the asserted to unasserted signal and supplies it to the A/D controller 26. The A/D controller 26 restarts the A/D conversion from the discarded A/D conversion resultant bit in response to the unasserted A/D-stop_bit-shift signal 25.

As described above, the present embodiment 6 can improve the reliability of the A/D conversion data by discarding the A/D conversion resultant bit affected by the crosstalk noise occurring during the USB communication.

In addition, since the A/D conversion module 17 halts the A/D conversion only for the fixed time period counted by the general-purpose counter 23 from the detection of the USB communication, the present embodiment 6 can prevent the adverse effect of the crosstalk noise on the A/D conversion data.

EMBODIMENT 7

Figure 8:
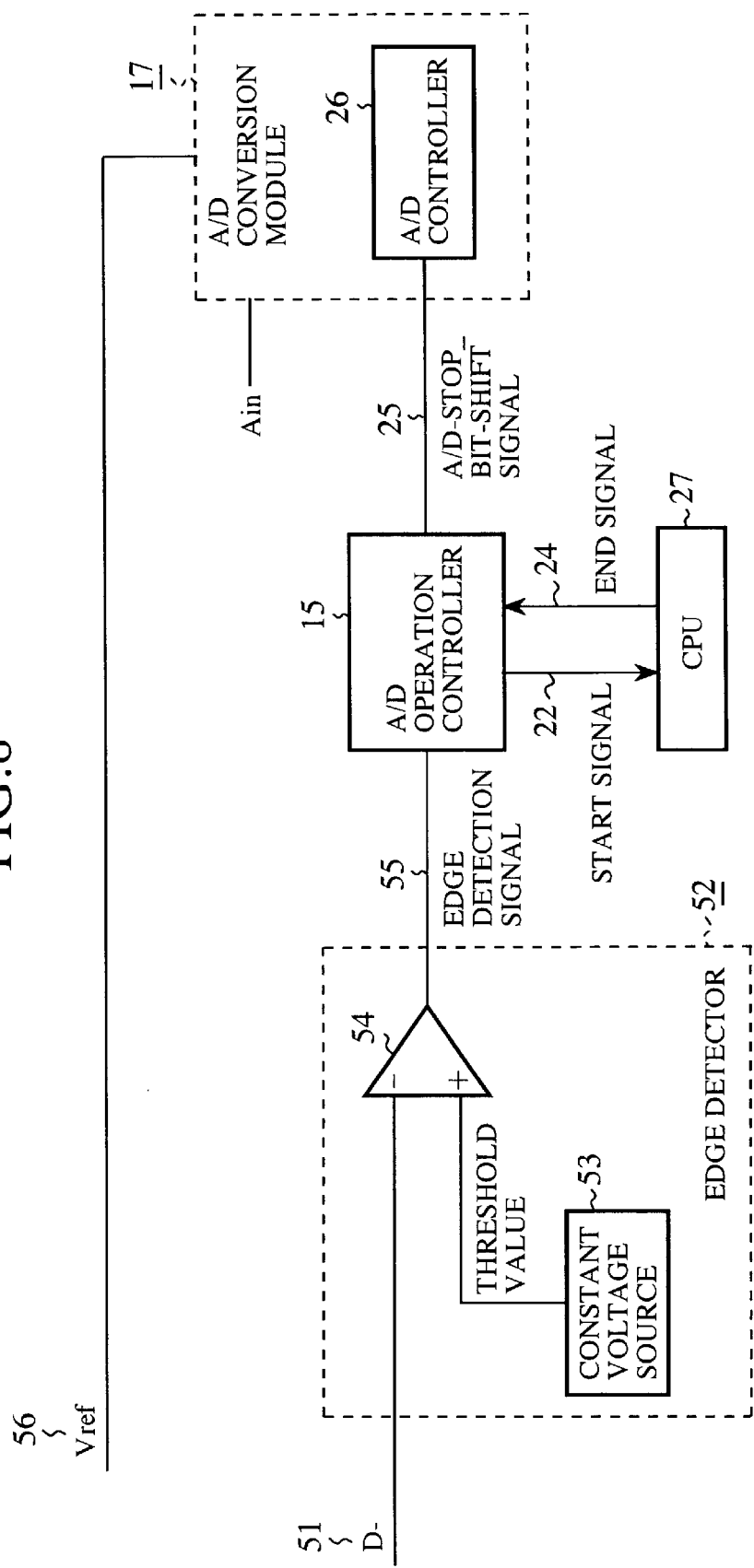
FIG. 8 is a block diagram showing a configuration of an embodiment 7 of the A/D converter in accordance with the present invention.

FIG. 8 is a block diagram showing a configuration of an embodiment 7 of the A/D converter in accordance with the present invention. In this figure, the reference numeral 27 designates a CPU that starts counting of the fixed time period on software in response to the start signal 22 fed from the A/D operation controller 21, and generates the end signal 24 at the end of the counting. The remaining configuration is the same as that of FIG. 7.

Next, the operation of the present embodiment 7 will be described.

The present embodiment 7 replaces the general-purpose counter 23 of the foregoing embodiment 6 by the CPU 27.

In FIG. 8, the CPU 27 starts counting the fixed time period on the software in response to the start signal 22, and supplies the end signal 24 to the A/D operation controller 21 at the end of the counting. The remaining operation is the same as that of the foregoing embodiment 6.

As described above, the present embodiment 7 can improve the reliability of the A/D conversion data by discarding the A/D conversion resultant bit affected by the crosstalk noise occurring during the USB communication.

In addition, since the A/D conversion module 17 halts the A/D conversion only for the fixed time period counted by the CPU 27 from the detection of the USB communication, it can prevent the adverse effect of the crosstalk noise on the A/D conversion data.

Furthermore, using the CPU 27 can obviate the need for the general-purpose counter 23.

EMBODIMENT 8

Figure 9:
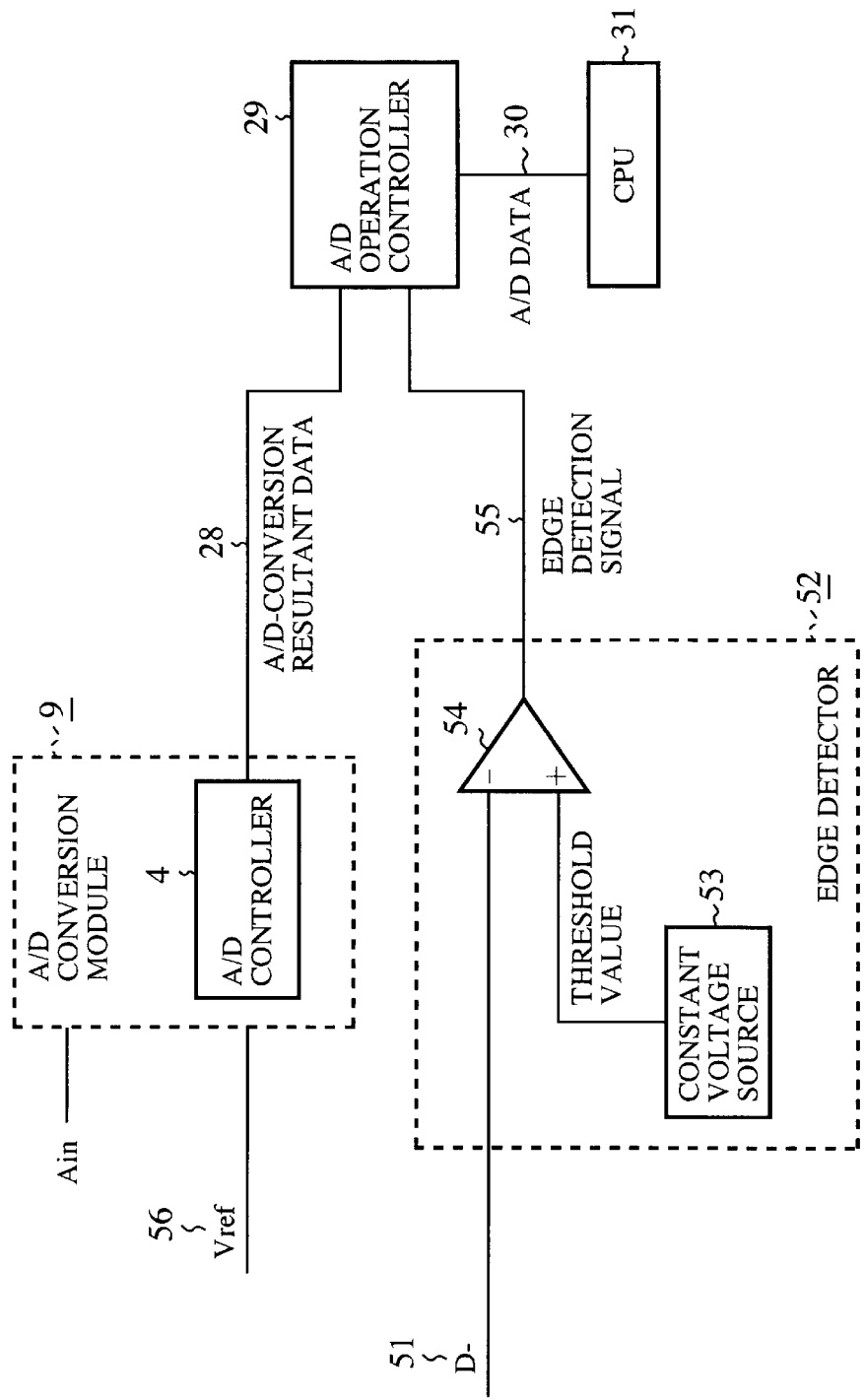
FIG. 9 is a block diagram showing a configuration of an embodiment 8 of the A/D converter in accordance with the present invention.
Figure 10:
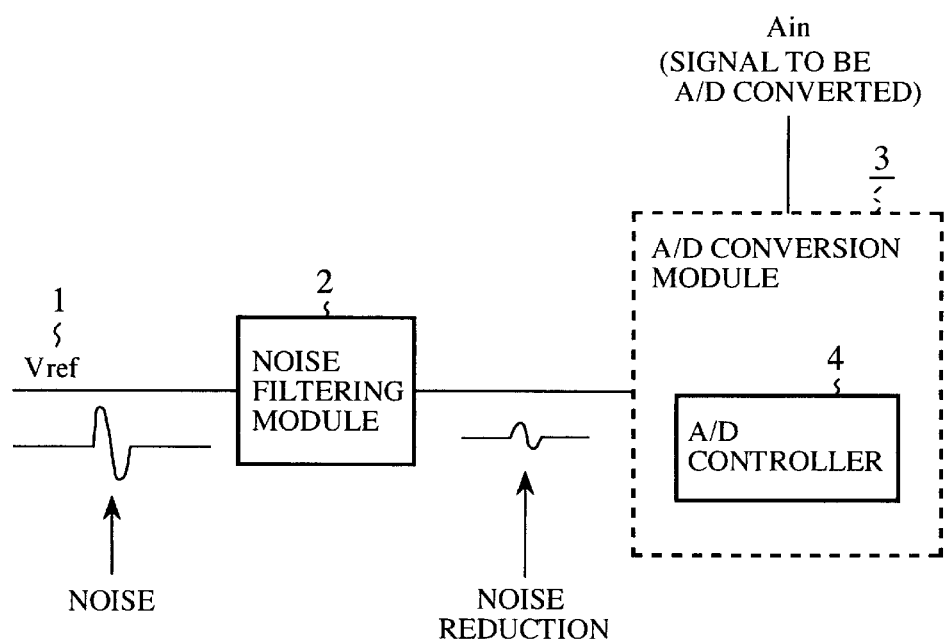
FIG. 10 is a block diagram showing a configuration of a conventional A/D converter.

FIG. 9 is a block diagram showing a configuration of an embodiment 8 of the A/D converter in accordance with the present invention. In this figure, the reference numeral 3 designates an A/D conversion module for converting the analog input Ain to the digital output in accordance with the A/D conversion reference voltage Vref 56; and 4 designates an A/D controller for controlling the A/D conversion module 3. The reference numeral 28 designates A/D conversion resultant data output from the A/D conversion module 3.

The reference numeral 29 designates an A/D operation controller that decides an A/D conversion resultant bit affected by noise in response to the edge detection signal 55 fed from the edge detector 52 and to the A/D conversion resultant data 28 fed from the A/D conversion module 3, and outputs A/D data 30 including the A/D conversion resultant data 28 and its reliability information. The reference numeral 31 designates a CPU for making a decision from the A/D data 30 as to whether to adopt the A/D conversion resultant data 28 or not in response to the reliability information. The remaining configuration is the same as that of FIG. 6.

Next, the operation of the present embodiment 8 will be described.

The A/D conversion module 3 converts the analog input Ain to the digital output with reference to the A/D conversion reference voltage Vref 56 provided through the USB communication, and outputs the A/D conversion resultant data 28.

The A/D operation controller 29 decides an A/D conversion resultant bit affected by noise in response to the edge detection signal 55 fed from the edge detector 52 and to the A/D conversion resultant data 28 fed from the A/D conversion module 3, and decides the reliability of the A/D conversion resultant data 28. Then, the A/D operation controller 29 outputs the A/D data 30 including the A/D conversion resultant data 28 and its reliability information.

The CPU 31 makes a decision from the A/D data 30 as to whether to adopt the A/D conversion resultant data 28 or not in response to the reliability information.

As described above, the present embodiment 8 can learn the reliability of the A/D conversion resultant data 28 affected by the crosstalk noise occurring during the USB communication. As an example of using the reliability information, the present embodiment 8 can discard the A/D conversion resultant data 28 with the reliability below a certain level, thereby being able to improve the reliability of the A/D conversion data.

What is claimed is:

1. An A/D converter comprising:
   a detector for generating a detection signal when it detects a specified property of a detector input signal;
   an A/D operation controller for generating a bit-shift signal in response to the detection signal fed from said detector; and
   an A/D conversion module for carrying out A/D conversion with reference to an A/D conversion reference voltage, for discarding an A/D conversion resultant bit affected by noise in response to the bit-shift signal fed from said A/D operation controller, for holding remaining A/D conversion resultant bits, and for restarting the A/D conversion from the discarded A/D conversion resultant bit after the noise becomes negligible.

2. The A/D converter according to claim 1, wherein said detector consists of a noise detector that receives the A/D conversion reference voltage as the detector input signal, and generates a noise detection signal as the detection signal when it detects noise of the A/D conversion reference voltage as the specified property.

3. The A/D converter according to claim 2, further comprising a counter, wherein
   said A/D operation controller generates a start signal in response to the noise detection signal fed from said noise detector, and continues to produce an asserted A/D-stop_bit-shift signal during a time period from generating the start signal to receiving an end signal from said counter;
   said counter starts counting a fixed time period in response to the start signal fed from said A/D operation controller, and generates the end signal at an end of the counting; and
   said A/D conversion module discards an A/D conversion resultant bit affected by noise in response to the asserted A/D-stop_bit-shift signal fed from said A/D operation controller, holds remaining A/D conversion resultant bits, and restarts the A/D conversion from the discarded A/D conversion resultant bit in response to an unasserted A/D-stop_bit-shift signal fed from said A/D operation controller.

4. The A/D converter according to claim 1, wherein said detector consists of an edge detector that receives a USB communication signal as the detector input signal, and generates an edge detection signal as the detection signal when it detects an edge of the USB communication signal as the specified property, and wherein said A/D conversion module carries out A/D conversion with reference to an A/D conversion reference voltage provided by USB communication.

5. The A/D converter according to claim 4, further comprising a counter, wherein
   said A/D operation controller generates a start signal in response to the edge detection signal fed from said edge detector, and continues to produce an asserted A/D-stop_bit-shift signal during a time period from generating the start signal to receiving an end signal from said counter;
   said counter starts counting a fixed time period in response to the start signal fed from said A/D operation controller, and generates the end signal at an end of the counting; and
   said A/D conversion module discards an A/D conversion resultant bit affected by noise in response to the asserted A/D-stop_bit-shift signal fed from said A/D operation controller, holds remaining A/D conversion resultant bits, and restarts the A/D conversion from the discarded A/D conversion resultant bit in response to an unasserted A/D-stop_bit-shift signal fed from said A/D operation controller.

6. An A/D converter comprising:
   a detector for generating a detection signal when it detects a specified property of a detector input signal;
   an A/D conversion module for generating A/D conversion resultant data by carrying out A/D conversion of an analog input signal with reference to an A/D conversion reference voltage; and
   an A/D operation controller for deciding an A/D conversion resultant bit affected by noise in response to the detection signal fed from said detector and to the A/D conversion resultant data fed from said A/D conversion module, and for outputting reliability information together with the A/D conversion resultant data.

7. The A/D converter according to claim 6, wherein said detector consists of a noise detector that receives the A/D conversion reference voltage as the detector input signal, and generates a noise detection signal as the detection signal when it detects noise of the A/D conversion reference voltage as the specified property.

8. The A/D converter according to claim 6, wherein said detector consists of an edge detector that receives a USB communication signal as the detector input signal, and generates an edge detection signal as the detection signal when it detects an edge of the USB communication signal as the specified property, and wherein said A/D conversion module carries out A/D conversion of the analog input signal with reference to an A/D conversion reference voltage provided by USB communication.

* * * * *